United States Patent
Hatsch et al.

(10) Patent No.: US 7,158,396 B2
(45) Date of Patent: Jan. 2, 2007

(54) CAM (CONTENT ADDRESSABLE MEMORY) APPARATUS

(75) Inventors: Noel Hatsch, Unterhaching (DE); Winfried Kamp, München (DE); Siegmar Köppe, München (DE); Thomas Künemund, München (DE); Heinz Söldner, Bruckmühl-Heufeldmühle (DE); Michel D'Argouges, München (DE)

(73) Assignee: Infineon Technologies AG, Munich (DE)

( * ) Notice: Subject to any disclaimer, the term of this patent is extended or adjusted under 35 U.S.C. 154(b) by 363 days.

(21) Appl. No.: 10/723,833

(22) Filed: Nov. 26, 2003

(65) Prior Publication Data

US 2004/0162937 A1 Aug. 19, 2004

(30) Foreign Application Priority Data

Nov. 26, 2002 (DE) ................................ 102 61 919

(51) Int. Cl.
*G11C 15/00* (2006.01)
(52) U.S. Cl. .................................... 365/49; 365/189.07
(58) Field of Classification Search .................. 365/49, 365/189.07
See application file for complete search history.

(56) References Cited

U.S. PATENT DOCUMENTS

| 6,000,008 | A  | * | 12/1999 | Simcoe ........................ 711/108 |
| 6,199,140 | B1 | * | 3/2001  | Srinivasan et al. .......... 711/108 |
| 6,215,685 | B1 | * | 4/2001  | Fung et al. .................... 365/49 |
| 6,286,091 | B1 | * | 9/2001  | Park ............................ 711/207 |
| 6,421,265 | B1 | * | 7/2002  | Lien et al. ...................... 365/49 |
| 6,944,709 | B1 | * | 9/2005  | Nataraj et al. .............. 711/108 |
| 2001/0017801 | A1 | * | 8/2001 | Helwig et al. ............... 365/201 |
| 2004/0213027 | A1 | * | 10/2004 | Liu et al. ...................... 365/49 |

* cited by examiner

*Primary Examiner*—Michael Tran
(74) *Attorney, Agent, or Firm*—Maginot, Moore & Beck

(57) ABSTRACT

The present invention provides a CAM (content addressable memory) apparatus having: a first memory device (10) with a word line input (WL) and at least one storage node (12; 13) for storing a first bit of a data word; a second memory device (11) with a word line input (WL) and at least one storage node (14; 15) for storing a second bit of a data word; and a comparator device (16) for comparing the first and second stored bits with two precoded comparison bits fed via four inputs (20; 21; 22; 23) and for driving a hit node (17) in the event of the first stored bit corresponding to the first comparison bit and the second stored bit corresponding to the second comparison bit.

22 Claims, 4 Drawing Sheets

CAM (CONTENT ADDRESSABLE MEMORY) APPARATUS

The present invention relates to a CAM (Content Addressable Memory) apparatus, and in particular to a CAM apparatus for predecoded search words.

Integrated circuits nowadays often have CAM apparatuses (Content Addressable Memories). These are memory devices which permit not only read and write accesses but also the search for an entry in the memory.

The operation of a CAM according to the prior art is explained below with reference to FIG. 3. Connection data are stored in an Ethernet router, which data inform the router of which IP address is allocated to which port and is to be forwarded. For this purpose, the IP addresses are stored within a CAM array 31. If the router receives an IP packet 32, then a search is made for the IP address in the array 31. When it is found, the associated hit line 33 is activated, which drives a customary memory array 34 in which the port number 35 is stored.

A further area of application primarily for binary CAMs presents itself in the area of cache memories of processors. Said cache memories enable a faster data access for the central processing unit CPU than an external ran memory. The current data or the data stored last are always stored in a cache memory since the probability of further processing of these data is very high. Since the stored address ranges continually change in this instance of use, the associated address word is also stored with respect to each data word. A CAM apparatus is then used to search for the address word sought and, after finding said address word, to output the associated data word.

To date, CAM apparatuses have usually been constructed from CAM basic cells which each store a data bit and compare this data bit with the respective search word bit by means of a comparator. A variety of alternatives are known for the realization of comparators. In addition to static CMOS solutions, there are also noncomplementary or dynamic variants which may optionally also operate with reduced signal levels.

The data bit is normally stored in a 6-transistor SRAM cell or a cell derived therefrom, as explained with reference to FIG. 4. For this purpose, all the data bits of the same significance are connected via an external bit line pair BL1, BL1Q, in the quiescent state both bit lines BL1, BL1Q being at a high level (precharge). During reading, writing and comparison, one of the two bit lines BL1, BL1Q must in each case be discharged in order to apply the respective data or search word bit to the cells This means, however, that during all accesses to the CAM apparatus, one bit line per bit is in each case discharged to the respective low bit level, which must be charged to the high level again in the subsequent precharge period. A complementary solution in which precharging to a low level is effected is likewise used. What proves to be problematic in this case is primarily the power loss that occurs in this case as a result of the continual discharging or charging of one bit line per bit.

Therefore, the object of the present invention is to provide a CAM apparatus which has a low power loss.

The idea on which the present invention is based essentially consists in providing a CAM apparatus which does not subject one bit line/comparison line per search word bit to charge reversal, but rather provides only one bit line/comparison line for two search word bits. The comparison of two adjacent data bits with the two corresponding search word bits is then fed in parallel to a common comparator by means of four comparison lines and processed at said comparator. The four comparison line signals, representing all possible states of the two search word bits, are preferably generated by a preprocessing device outside the CAM array.

By means of an arrangement of this type, it is possible, during the comparison, on the one hand, to halve the power loss which occurs when subjecting the bit lines or the comparison lines to charge reversal. On the other hand, the hit line, which combines the decision of n local stages to form a global result, can be assessed more rapidly since only half as many comparison results have to be processed.

In the present invention, the problem mentioned in the introduction is solved in particular by virtue of the fact that a CAM apparatus is provided, having a first memory device with a word line input, two first bit line inputs and a first and second storage node for storing a first bit of a data word; a second memory device with a word line input, two second bit line inputs and a third and fourth storage node for storing a second bit of a data word; and a comparator device for comparing the first and second stored bits with two precoded comparisons bits fed via four inputs and for driving a hit node in the event of the first stored bit corresponding to the first comparison bit and the second stored bit corresponding to the second comparison bit.

Advantageous developments and improvements of the subject matter of the invention are found in the subclaims.

In accordance with one preferred development, the comparator device has four signal paths via in each case three transistors between a supply voltage and the hit node.

In accordance with a further preferred development, the comparator device has a series-parallel circuit comprising twelve field-effect transistors of a first conduction type.

In accordance with a further preferred development, the comparator device has four parallel-connected series circuits comprising in each case three field-effect transistors of the first conduction type.

In accordance with a further preferred development, the comparator device has a series-parallel circuit comprising eight field-effect transistors of a first conduction type.

In accordance with a further preferred development, the first, second, third and fourth storage node of the memory devices are connected to gate terminals of two field-effect transistors of the first conduction type of a respective path of the series-parallel circuit in such a way that one path can be switched through for each of the four bit combinations possible from two bits.

In accordance with a further preferred development, a respective third transistor of one of the four paths is connected, on the gate side, in each case to one of the four inputs for feeding the two precoded comparison bits.

In accordance with a further preferred development, the comparator device has a field-effect transistor of a second conduction type with a control terminal, which differs from the first conduction type, and is located between the hit node and a reference potential.

In accordance with a further preferred development, the field-effect transistor of the second power [sic] type can be switched through via the control terminal if all the comparison lines have a predetermined signal level.

In accordance with a further preferred development, the comparator device has four series-connected field-effect transistors of a second conduction type, which differs from the first conduction type.

In accordance with a further preferred development, the four field-effect transistors of the second conduction type are connected in series with a series-parallel circuit comprising field-effect transistors of the first conduction type between the hit node and a reference potential.

In accordance with a further preferred development, the field-effect transistors of the first conduction type form a p channel and the field-effect transistors of the second conduction type form an n channel.

In accordance with a further preferred development, the field-effect transistors of the first conduction type form a n channel and the field-effect transistors of the second conduction type form an p channel.

In accordance with a further preferred development, the comparator device has a holding device for maintaining a signal level at the hit node.

In accordance with a further preferred development, the holding device has three transistors, of which a first and a second form an inverter, the input of which is connected to the hit node, and the output of which is connected to a gate of the third transistor.

In accordance with a further preferred development, a circuit which is upstream of the CAM apparatus and serves for generating the two precoded comparison bits can be operated statically or dynamically.

In accordance with a further preferred development, both a downstream series pass gate hit path and a wired-Or hit path can be driven via the hit node.

In accordance with a further preferred development, the memory devices are in each case constructed identically.

In accordance with a further preferred development, the memory devices in each case have six transistors, four of which form two antiparallel inverters Exemplary embodiments of the invention are illustrated in the drawings and explained in more detail in the description below.

In the figures.

In the figures, identical reference symbols designate identical or functionally identical constituent parts.

Figure 1:
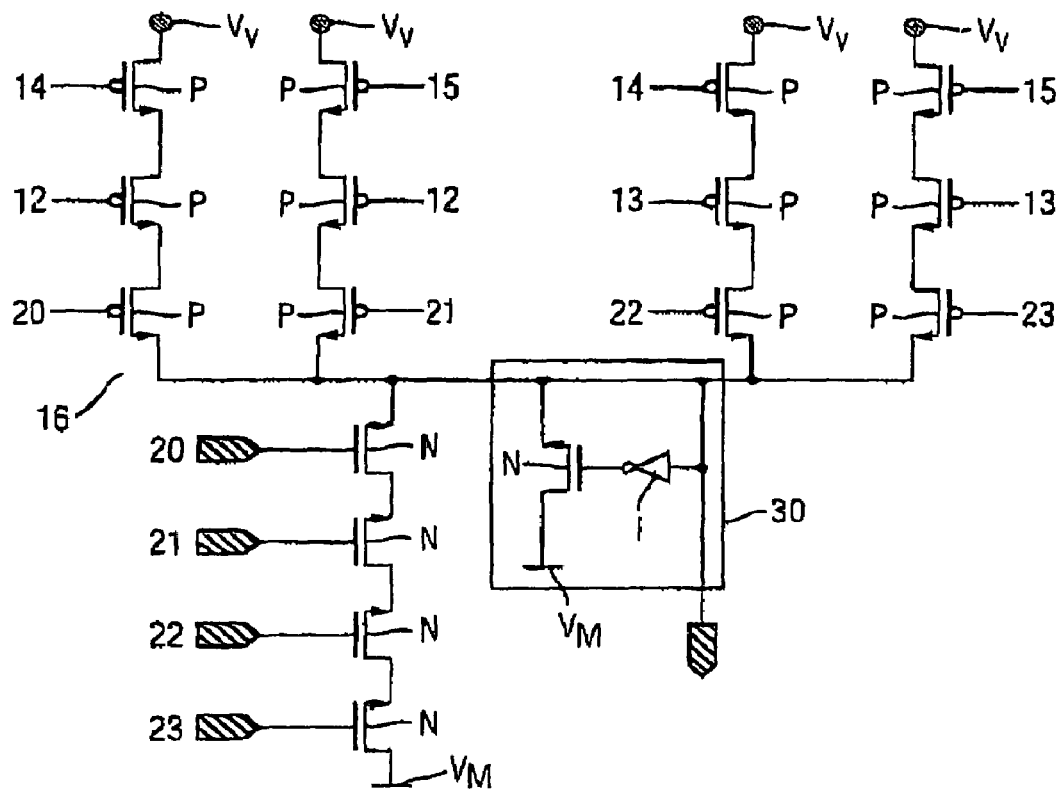
FIGS. 1, 1a show a schematic circuit arrangement for elucidating a first embodiment of the present invention, FIG. 1 illustrating a comparator according to the invention and FIG. 1a illustrating two exemplary memory devices.
Figure 1A:
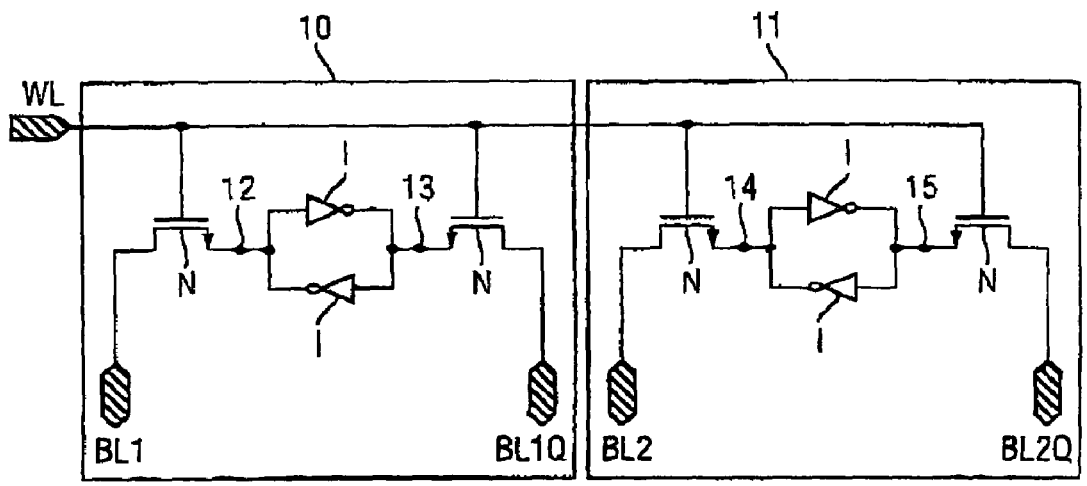

FIG. 1a illustrates a first exemplary memory device 10 and a second exemplary memory device 11, which are essentially constructed identically. A respective bit can be written to and read from the memory device 10, 11 via a first bit line pair BL1, BL1Q and, respectively, via a second bit line pair BL2, BL2Q, depending on the activation via a word line WL. A memory device 10, 11 has six transistors, four of which form two inverters I connected back-to-back. The inverters I connected back-to-back are located between a first storage node 12 and a second storage node 13, the second memory device 11 having a third storage node 14 and a fourth storage node 15 of the memory device 10, 11.

The bit line BL1 can be connected to the first storage node 12 via an n-channel transistor whose gate is driven by the word line WL. The second storage node 13 can likewise be connected to the bit line BL1Q via an n-channel transistor n, which is driven via the word line WL on the gate side, said bit line BL1Q carrying the complementary signal with respect to the signal on the bit line BL1 during writing and reading. The same applies correspondingly to the second memory device 11. The 2-bit CAM cell in accordance with a preferred embodiment is based on two static 6-transistor RAM cells 10, 11 which each hold a bit of a stored data word. However, it is also possible to use any desired memory device which has corresponding outputs 12, 13, 14, 15. If no complementary outputs 13, 15 are present, then it is necessary, if appropriate, to supplement the structure by a respective inverter I in order to generate such complementary outputs.

FIG. 1 illustrates a comparator device 16, which, together with the memory device 10, 11, forms a CAM apparatus in accordance with a first embodiment of the present invention. The comparator device 16 has four parallel paths with in each case three series-connected p-channel field-effect transistors P between a supply voltage $V_v$ and a hit node 17 or match node 17. On the gate side, a first p-channel transistor of a first of the four parallel paths is connected to the third storage node 14 of the memory device 11. The gate of a second p-channel transistor P of said first path is connected to the first storage node 12 of the memory device 10, and a third p-channel transistor P in said first path is connected to a first comparison line 20.

A second path of the four parallel paths has a first p-channel transistor P, the gate of which is connected to the fourth storage node 15 of the memory device 11, a second p-channel transistor P being connected to the first storage node 12 of the memory device 10 on the gate side. A third p-channel field-effect transistor P in this branch has a connection to a second comparison line 21.

A third path of the four parallel paths has a first p-channel field-effect transistor P, the gate of which is connected to the third storage node 14 of the memory device 11. A second p-channel transistor of the third path has a connection on the gate side to the second storage node 13 of the memory device 10, and a third p-channel field-effect transistor P is provided with a connection to a comparison line 22 on the gate side.

A fourth path of the four parallel paths, finally, provides a first p-channel transistor P, the latter having a gate connected to the fourth storage node 15.

Furthermore, a second p-channel transistor is connected to the second storage node 13 of the memory device 10 on the gate side, and a third p-channel transistor P has a connection between its gate and a fourth comparison line 23.

The hit node 17 can be connected to a reference potential $V_M$ via a series circuit comprising 4 n-channel field-effect transistors N, said n-channel field-effect transistors N respectively being connected on the gate side to the first, second, third and fourth comparison lines 20, 21, 22 and 23. Consequently, in each case the first two p-channel transistors of the four parallel sections are connected to the storing nodes 12, 13, 14, 15 of the memory devices 10, 11, i.e. of the RAM cells, in such a way that each of the four possible stored data bit combinations given two bits can be represented. This interconnection ensures that at most only one of the four parallel p-channel transistor series circuits can become conducting. The respective third transistor P in the four parallel paths is connected to one of the correspondingly precoded comparison lines 20, 21, 22, 23.

The preceding is preferably effected upstream, so that the first comparison line 20 for example is activated, i.e. provided with a signal which switches a corresponding connected transistor P, N, if the coding of the two search word bits is e.g. 00. The same applies correspondingly to the second comparison line 21, which represents e.g. 01, the third comparison line 22 being activated when the coding of the two search word bits is 10 and, correspondingly, the fourth comparison line 23 switching a transistor (P or N channel) correspondingly connected thereto in the case of the search word bits 11.

If e.g. a 0 is written as first bit in the first memory device 10, by way of example, a low level is present at the first storage node 12 and a high level at the second storage node 13. If e.g. a 0 is written as second bit in the second memory device 11, by way of example, a low level is present at the third storage node 14 and a high level at the fourth storage node 15. If the comparison bit pair is now likewise 00, then a low level is likewise present on the first comparison line 20 (all the other comparison lines 21, 22, 23 are at high) and the left outer section is switched through, the potential at the hit node 17 being raised to $V_v$, i.e. a positive comparison result being output. If the comparison bit pair is now alternatively e.g. 01, then a low level is present on the second comparison line 21 (all the other comparison lines 20, 22, 23 are at high), none of the sections is switched through and the potential at the hit node 17 is not raised, i.e. a negative comparison result is output.

Consequently, depending on the content of the two memory or RAM cells 10, 11, precisely one of the four p-channel transistor series circuits detects the equality or inequality between the two data bits stored in the memory devices 10, 11 and the two comparison data bits precoded in the comparison lines 20 to 23.

If the CAM apparatus is not in the search mode, like before each search operation for example, preferably all four comparison lines 20, 21, 22 and 23 are deactivated, i.e. put at a high level ($V_v$) in the exemplary embodiment in accordance with FIG. 1. Consequently, by means of the series circuit of the four n-channel field-effect transistors, the hit node 17 is put at or precharged to the low level ($V_M$) (precharge). If the comparator device 16 detects an equality between the two bits stored in the memory device 10, 11 and the two search word bits, then the hit node 17 is subjected to charge reversal to the high level ($V_v$) by means of precisely one of the four parallel p-channel transistor series circuits. In the event of inequality, by contrast, the hit node 17 remains at the previously initiated low level.

In order to suppress a possible fluctuation of the potential at the hit node 17 (floating) in the event of a relatively long phase of inequality, the comparator device 16 may be supplemented by a holding device 30, as illustrated in the exemplary embodiment. The holding device 30 is provided with an inverter I, which, on the input side, is connected to the hit node 17 and to the output of which is connected the gate of an n-channel field-effect transistor N. Said n-channel field-effect transistor N connects the hit node 17 to the reference potential $V_M$ as long as the potential at the hit node 17 does not exceed a predetermined value.

Figure 2:
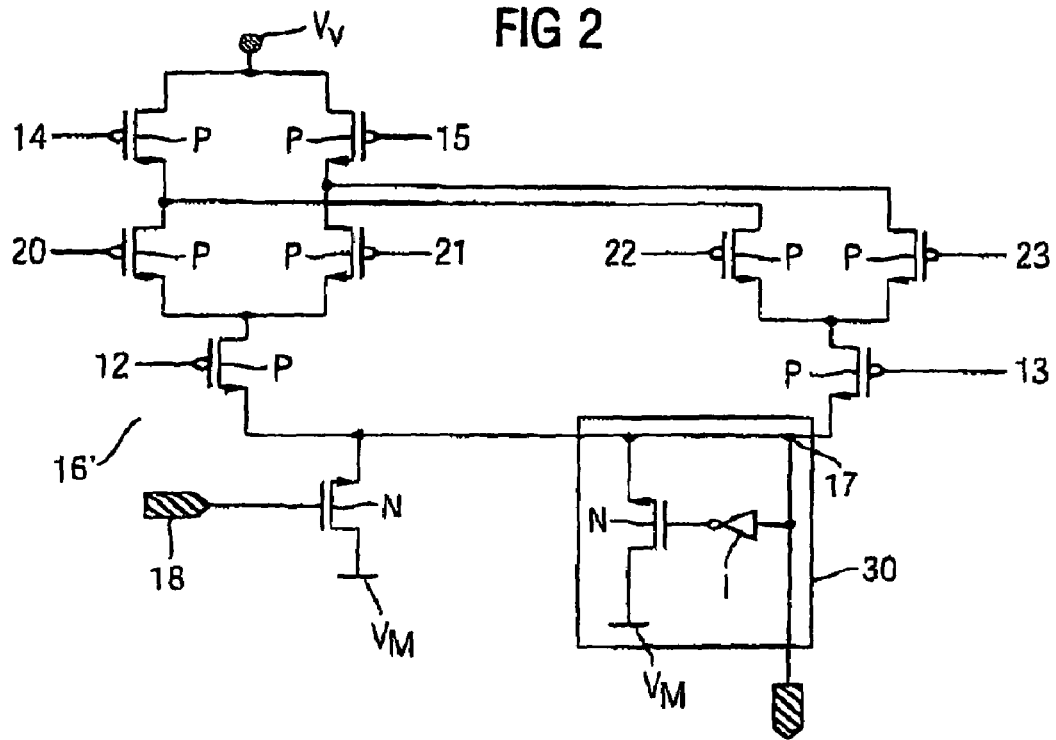
FIGS. 2, 2a show a schematic circuit arrangement for elucidating a second embodiment of the present invention, FIG. 2 illustrating a comparator according to the invention and FIG. 2a illustrating two exemplary memory devices.
Figure 2A:
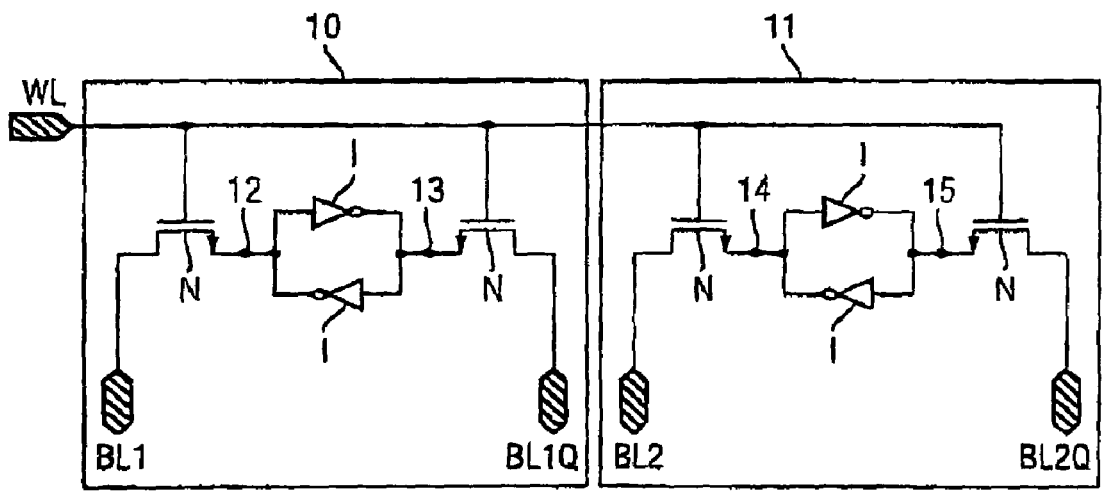
Figure 3:
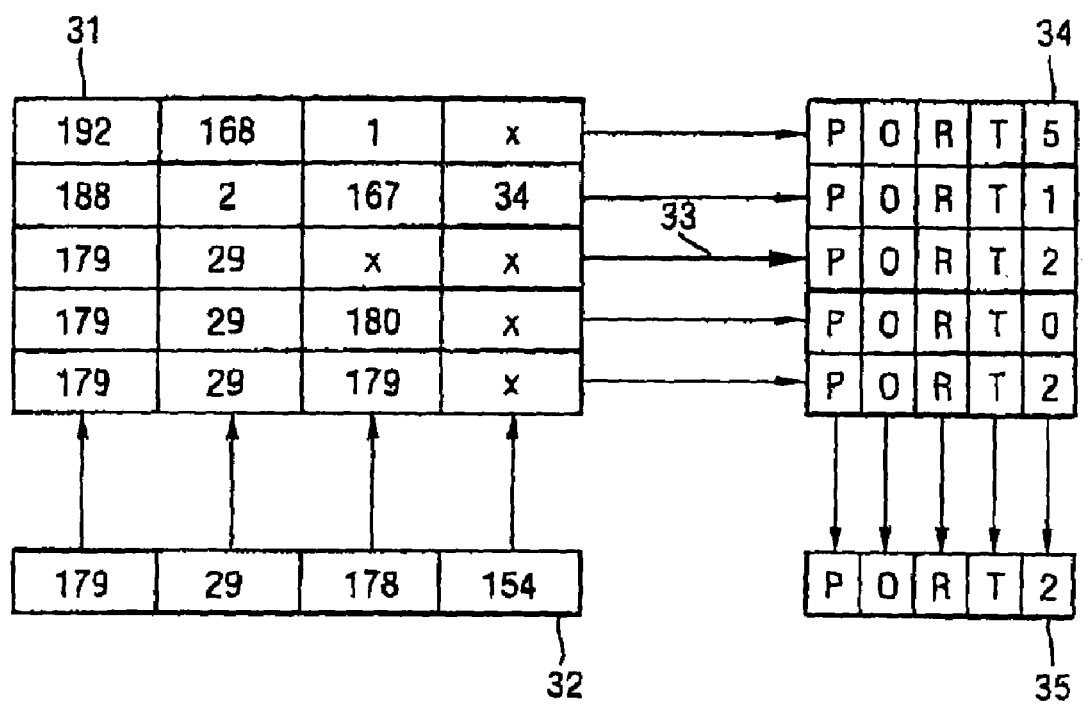
FIG. 3 shows a diagram for elucidating the known CAM principle.
Figure 4:
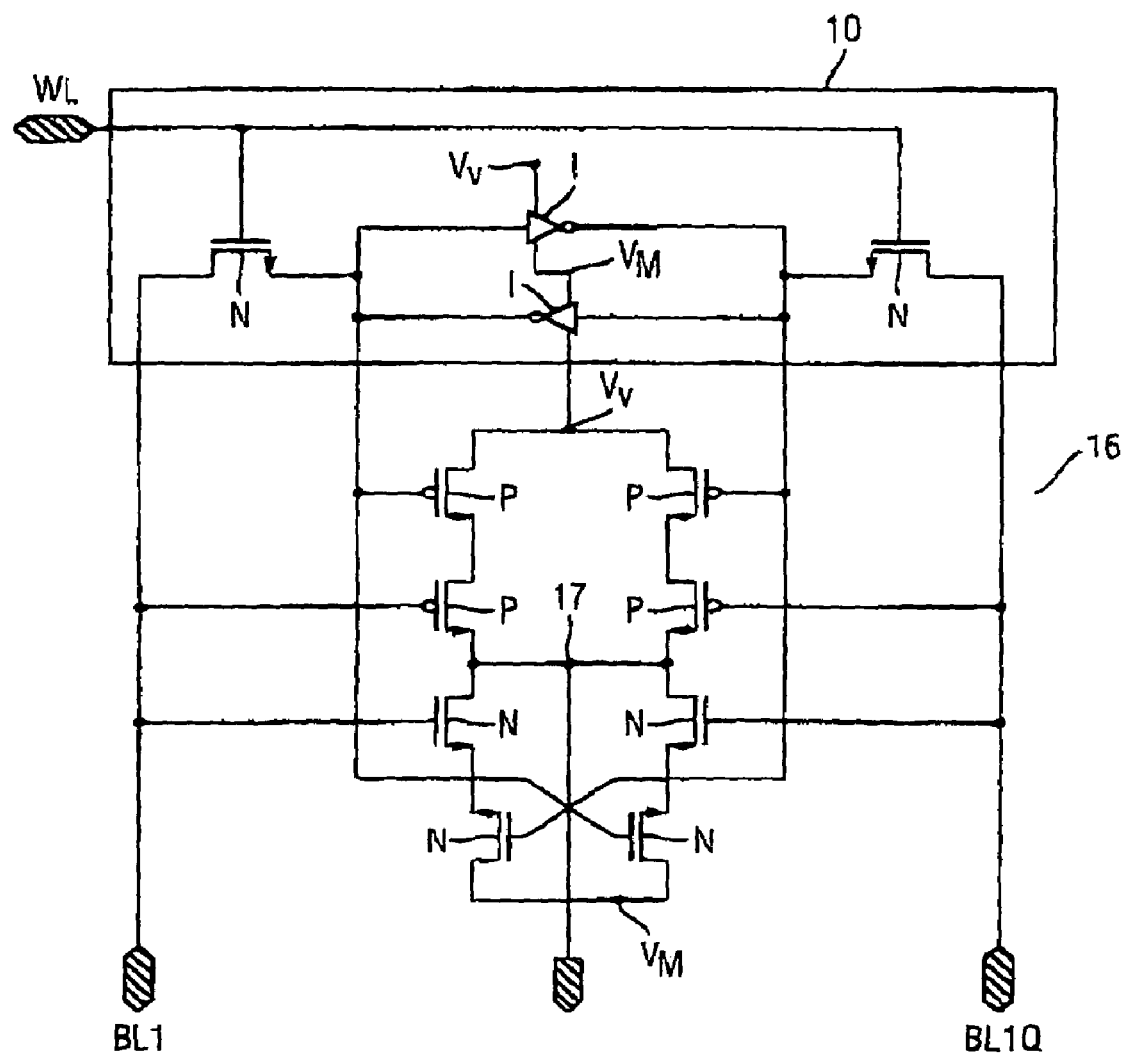
FIG. 4 shows a schematic circuit arrangement for elucidating a customary CAM apparatus.

FIG. 2a illustrates a memory circuit identical to that described with reference to FIG. 1a.

FIG. 2 shows an exemplary embodiment with a reduced outlay in comparison with FIG. 1, with only 8 p-channel transistors in comparison with the 12 p-channel transistors in accordance with FIG. 1.

In this case, too, provision is made of four parallel signal paths via in each case three serial p-channel field-effect transistors P. A first path between a supply voltage $V_v$ and a hit node 17 runs via a transistor connected to the third storage node 14 on the gate side, a transistor connected to the first comparison line 20 on the gate side, and a transistor connected to the first storage node 12 on the gate side. A second path runs via a transistor connected to the third storage 14 on the gate side, a transistor connected to the third comparison line 22 on the gate side, and a transistor connected to the second storage node 13 on the gate side. A third path is provided via a p-channel transistor P, which is connected to the fourth storage node 15 on the gate side, a transistor connected to the second comparison line 21 on the gate side, and a transistor P connected to the first storage node 12 on the gate side. Finally, a fourth path results via the p-channel field-effect transistor P connected to the fourth storage node 15 on the gate side, an identical transistor connected to the fourth comparison line 23 on the gate side, and a p-channel field-effect transistor P connected to the second storage node 13 on the gate side.

In contrast to FIG. 1, in the exemplary embodiment in accordance with FIG. 2, only two instead of four first transistors occur, one connected to the third storage node 14 on the gate side and the other connected to the fourth storage node 15 on the gate side, which by then split only two paths onto four paths with four p-channel field-effect transistors P lying in the path, which transistors are connected, on the gate side, to the first, second, third and fourth comparison lines 20, 21, 22 and 23 for feeding two precoded comparison bits, in order then to be combined onto two paths again via two transistors connected to the first and second storage node 12, 13 on the gate side. Instead of the series circuit comprising four n-channel field-effect transistors N described with reference to FIG. 1, one n-channel field-effect transistor N with a control terminal 18 is provided in accordance with FIG. 2. This single n-channel field-effect transistor is switched through if all four comparison lines 20, 21, 22, 23 are inactive.

In the exemplary embodiment in accordance with FIG. 2, not only the number of transistors of the p-channel transistor paths but also the loading on the internal nodes of each memory cell 12, 13, 14, and 15 is approximately halved.

Although the present invention has been described above on the basis of two preferred exemplary embodiments, it is not restricted thereto, but rather can be modified in diverse ways Thus, primarily the comparator can also be constructed or connected complementarily, i.e. the transistors of a first conduction type, e.g. p-channel transistors, can be replaced by transistors of the other conduction type (e.g. n-channel transistors), and vice versa. Furthermore a circuit for generating the comparison signals on the comparison lines 20, 21, 22 and 23 can be operated statically or dynamically, depending on the CAM environment. Finally, the hit path node 17 can drive both a series pass gate hit path or a wired-or hit path.

The 4-fold n-channel transistor series path can be replaced in any manner such that if all the comparison lines 20, 21, 22, 23 are inactive, the hit node 17 is suitably precharged (to potential $V_M$ in accordance with FIG. 2). By way of example, this is done via a single n-channel transistor with a separate control line 18.

Any other memory structure desired can be used for storing the two data bits in the memory devices 10, 11. If the memory structures used do not supply complementary outputs 13, 15, then it is necessary, if appropriate, to extend the comparator structure in a suitable manner by means of two inverters I.

LIST OF REFERENCE SYMBOLS

10 Memory device
11 Memory device
12 First storage node
13 Second storage node
14 Third storage node 15 Fourth storage node
16 Comparator device
17 Hit node
18 Drive line
20 First precoded comparison line
21 Second precoded comparison line
22 Third precoded comparison line
23 Fourth precoded comparison line
30 Holding device
31 CAM array (content addressable memory array)
32 IP packet
33 Hit line
34 Memory array
35 Port number
BL1 Bit line
BL1Q Bit line with inverse signal with respect to BL1
BL2 Bit line
BL2Q Bit line with inverse signal with respect to BL2
$V_v$ Supply voltage
$V_M$ Reference potential, e.g. ground
N n-channel field-effect transistor
P p-channel field-effect transistor

The invention claimed is:

1. A CAM (content addressable memory) apparatus comprising:
 a first memory device with a word line input and at least one storage node for storing a first bit of a data word;
 a second memory device with a word line input and at least one storage node for storing a second bit of a data word; and
 a comparator device for comparing the first and second stored bits with first and second precoded comparison bits fed via four inputs and for driving a hit node in the event of the first stored bit corresponding to the first comparison bit and the second stored bit corresponding to the second comparison bit.

2. The CAM apparatus according to claim 1, wherein the comparator device has a holding device for maintaining a signal level at the hit node.

3. The CAM apparatus according to claim 2, wherein the comparator device has four signal paths each having three transistors between a supply voltage and the hit node.

4. The CAM apparatus according to claim 3, wherein the holding device has three transistors, of which a first transistor of the three transistors and a second transistor of the three transistors forms an inverter the input of which is connected to the hit node and the output of which is connected to a gate of a third transistor of the three transistors.

5. The CAM apparatus according to claim 3, wherein a circuit that is upstream of the CAM apparatus generates the two precoded comparison bits and can be operated statically or dynamically.

6. The CAM apparatus according to claim 3, wherein both a downstream series pass gate hit path and a wired-Or hit path can be driven via the hit node.

7. The CAM apparatus according to claim 1, wherein the memory devices are in each case constructed identically and in each case have six transistors, four of which form two antiparallel inverters.

8. A CAM (content addressable memory) apparatus comprising:
 a first memory device with a word line input and at least one storage node for storing a first bit of a data word;
 a second memory device with a word line input and at least one storage node for storing a second bit of a data word; and
 a comparator device for comparing the first and second stored bits with first and second precoded comparison bits fed via four inputs and for driving a hit node in the event of the first stored bit corresponding to the first comparison bit and the second stored bit corresponding to the second comparison bit;
 wherein the comparator device has four signal paths each having three transistors between a supply voltage and the hit node.

9. The CAM apparatus according to claim 8, wherein the comparator device has a series-parallel circuit comprising twelve field-effect transistors of a first conduction type.

10. The CAM apparatus according to claim 9, wherein the comparator device has four parallel-connected series circuits comprising in each case three field-effect transistors of the first conduction type.

11. The CAM apparatus according to claim 8, wherein the comparator device has a series-parallel circuit comprising eight field-effect transistors of a first conduction type.

12. The CAM apparatus according to claim 8, wherein a first, second, third and fourth storage node of the memory devices are connected to gate terminals of a first and second field-effect transistor of the first conduction type of a respective path of a series-parallel circuit in such a way that precisely one path can be switched through by each of the four bit combinations possible from two bits.

13. The CAM apparatus according to claim 12, wherein a respective third transistor of each one of the four paths is connected, on the gate side, to a respective one of the four inputs for inputting the first and second precoded comparison bits.

14. The CAM apparatus according to claim 9, wherein the comparator device has a field-effect transistor of a second conduction type which differs from the first conduction type, the field-effect transistor having a control terminal and located between the hit node and a reference potential.

15. The CAM apparatus according to claim 14, wherein the four input lines comprise four comparison lines and the field-effect transistor (N; P) of the second conduction type can be switched through via the control terminal if all of the comparison lines have a predetermined signal level.

16. The CAM apparatus according to claim 9, wherein the comparator device has four series-connected field-effect transistors of a second conduction type, which differs from the first conduction type.

17. The CAM apparatus according to claim 16, wherein the four field-effect transistors of the second conduction type are connected in series with a series-parallel circuit comprising field-effect transistors of the first conduction type between the hit node and a reference potential.

18. The CAM apparatus according to claim 9, wherein the field-effect transistors of the first conduction type form a p channel and the field-effect transistors of the second conduction type form an n channel.

19. The CAM apparatus according to claim 9, wherein the field-effect transistors of the first conduction type form an n channel and the field-effect transistors of the second conduction type form a p channel.

20. A CAM (content addressable memory) apparatus comprising:
 a first memory device with a word line input and at least one storage node for storing a first bit of a data word;
 a second memory device with a word line input and at least one storage node for storing a second bit of a data word; and
 a comparator device for comparing the first and second stored bits with first and second precoded comparison bits fed via four inputs and for driving a hit node in the event of the first stored bit corresponding to the first comparison bit and the second stored bit corresponding to the second comparison bit, wherein the comparator device has a holding device for maintaining a signal level at the hit node, wherein the holding device has three transistors, of which a first transistor and a second transistor form an inverter, the input of which is connected to the hit node and the output of which is connected to a gate of a third transistor of the three transistors.

21. A CAM (content addressable memory) apparatus comprising:

a first memory device with a word line input and at least one storage node for storing a first bit of a data word;

a second memory device with a word line input and at least one storage node for storing a second bit of a data word; and a comparator device for comparing the first and second stored bits with first and second precoded comparison bits fed via four inputs and for driving a hit node in the event of the first stored bit corresponding to the first comparison bit and the second stored bit corresponding to the second comparison bit;

wherein a circuit that is upstream of the CAM apparatus generates the two precoded comparison bits and can be operated statically or dynamically.

22. A CAM (content addressable memory) apparatus comprising:

a first memory device with a word line input and at least one storage node for storing a first bit of a data word;

a second memory device with a word line input and at least one storage node for storing a second bit of a data word; and a comparator device for comparing the first and second stored bits with first and second precoded comparison bits fed via four inputs and for driving a hit node in the event of the first stored bit corresponding to the first comparison bit and the second stored bit corresponding to the second comparison bit;

wherein both a downstream series pass gate hit path and a wired-Or hit path can be driven via the hit node.

* * * * *